(12) United States Patent
Chien

(10) Patent No.: US 7,113,754 B2
(45) Date of Patent: *Sep. 26, 2006

(54) HIGH FREQUENCY SIGNAL POWER DETECTOR

(75) Inventor: Hung-Ming (Ed) Chien, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 414 days.

This patent is subject to a terminal disclaimer.

(21) Appl. No.: 10/645,126

(22) Filed: Aug. 21, 2003

(65) Prior Publication Data

US 2005/0042995 A1 Feb. 24, 2005

(51) Int. Cl.
*H04B 17/00* (2006.01)
*H03C 1/62* (2006.01)
*G01R 19/00* (2006.01)

(52) U.S. Cl. ............................... 455/115.3; 455/226.2; 327/58

(58) Field of Classification Search ............ 455/67.11, 455/115.1, 115.3, 115.4, 226.1, 226.2, 226.3, 455/226.4; 327/58–62, 89, 50
See application file for complete search history.

(56) References Cited

U.S. PATENT DOCUMENTS

| 5,546,027 | A  | * | 8/1996  | Shinozaki et al. | 327/59  |
| 6,232,802 | B1 | * | 5/2001  | Chang et al.     | 327/59  |
| 6,836,156 | B1 | * | 12/2004 | Chien            | 327/58  |
| 2004/0214536 | A1 | * | 10/2004 | Chien         | 455/127.2 |

* cited by examiner

*Primary Examiner*—Nguyen T. Vo
(74) *Attorney, Agent, or Firm*—Garlick Harrison & Markison

(57) ABSTRACT

A signal power detector includes an input coupling circuit a rectifying operational amplifier, and a charge pump. The input coupling circuit is operably coupled to receive a signal and to convert the signal into a first input and a rectifying input. The rectifying operational amplifier is operably coupled to receive the first input and the rectifying input and to produce therefrom a rectified output signal that represents a peak of the received signal. The charge pump converts the rectified output into a corresponding current, wherein the corresponding current represents power of the signal.

18 Claims, 7 Drawing Sheets

TSSI module 95

TSSI module 95

TSSI module 95

TSSI module 95 signal diagram for TSSI 95 of FIG. 4 signal diagram for TSSI 95 of FIG. 5

HIGH FREQUENCY SIGNAL POWER DETECTOR

BACKGROUND OF THE INVENTION

1. Technical Field

This invention relate generally to communication systems and more particularly to transmit power control within such communication systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is also known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

The level at which the power amplifier amplifies the RF signals may be a fixed level or varied. In many applications, it is desirable to be able to adjust the transmit power level of the power amplifier to conserve power when less power will suffice. Typically, a lower transmit power may be used when the receiver that receives the signals of the transmitter receives the signals with a high received signal strength indication. In this instance, based on an indication of the received signal strength, the transmitter may reduce its transmit power level. To facilitate the transmit power level adjustment, the transmitter includes a transmit signal strength indication (TSSI) module.

While there are many ways in which a TSSI module may be implemented, when the TSSI module is implemented on an integrated circuit, there is a further need for simplification of circuitry with improved performance. Further, measuring the signal strength of a single-ended signal is done using one type of TSSI module, while measuring signal strength of a differential signal is done using a different type of TSSI module. Still further, as the rate of the signal increases (e.g. into the Giga Hertz range), TSSI modules become less accurate due to the speed and/or become more complex.

Therefore, a need exists for an accurate, flexible (e.g., handles single-ended and differential signals equally well), and compact transmit signal strength indication module.

BRIEF SUMMARY OF THE INVENTION

The high frequency signal power detector of the present invention substantially meets these needs and others. In one embodiment, a signal power detector includes an input coupling circuit, a rectifying operational amplifier, and a charge pump. The input coupling circuit is operably coupled to receive a signal and to convert the signal into a first input and a rectifying input. The rectifying operational amplifier is operably coupled to receive the first input and the rectifying input and to produce therefrom a rectified output signal that represents a peak of the received signal. The charge pump converts the rectified output into a corresponding current, wherein the corresponding current represents power of the signal. Such a high frequency signal power detector provides an accurate, flexible, and compact transmit signal strength indication module.

DETAILED DESCRIPTION OF THE INVENTION

Figure 1:
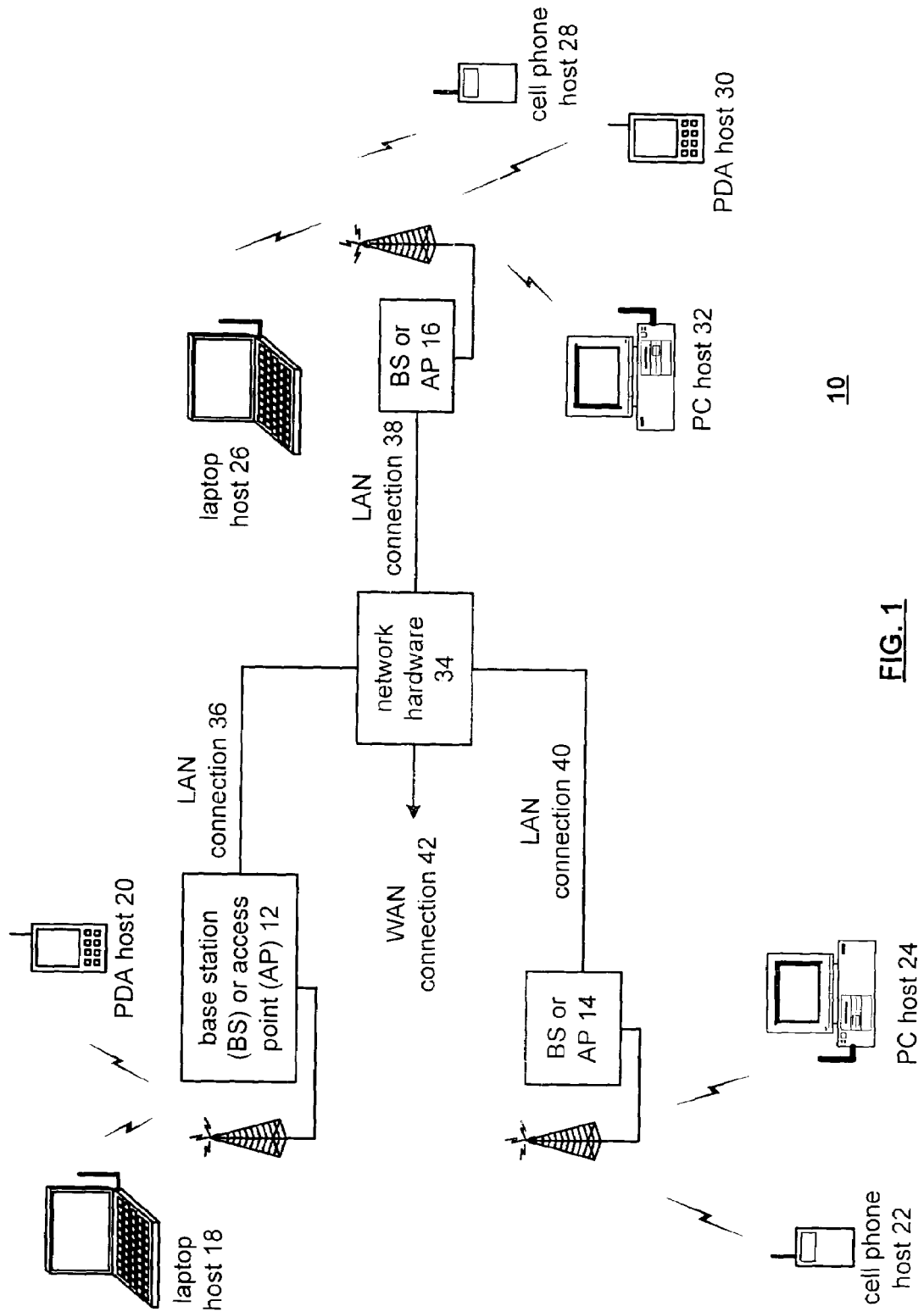
FIG. 1 is a schematic block diagram of a wireless communication system in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
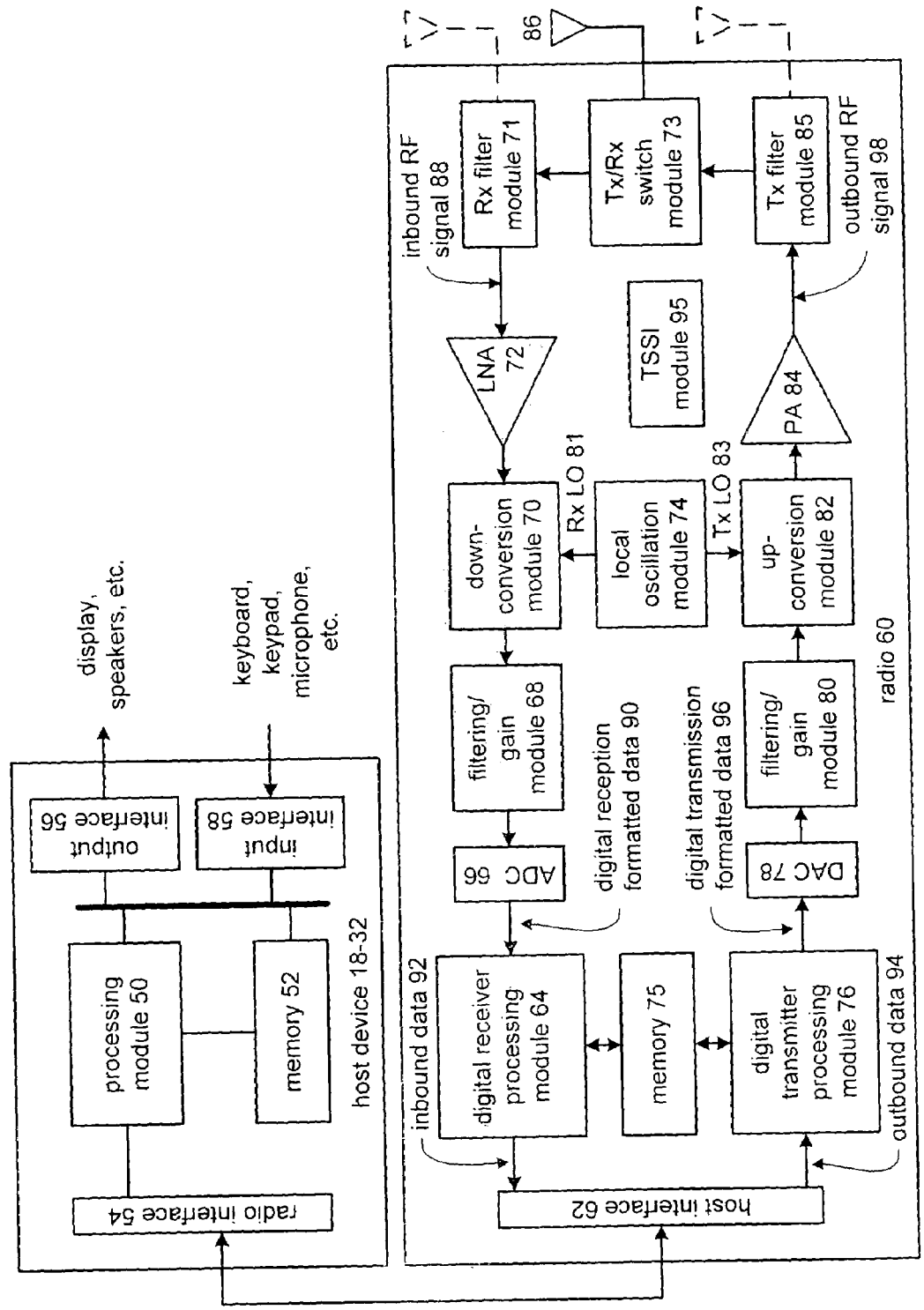
FIG. 2 is a schematic block diagram of a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/gain module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, a transmit signal strength indication (TSSI) module 95, and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11 Bluetooth. et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 converts the analog baseband or low IF signal into an RF signal based on a transmitter local oscillation 83 provided by local oscillation module 74. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The TSSI module 95 is operably coupled to measure the signal strength of the outbound RF signals 98, wherein the measured signal strength is used to adjust the transmit power levels. In one embodiment, the TSSI module 95 measures the outbound RF signals 98 as single-ended signals at the T/R switch module 73. Such an embodiment will be described in greater detail with reference to FIGS. 3, 4, and 6. In another embodiment, the TSSI module 95 measures the outbound RF signals 98 as differential signals at the output of the power amplifier 84 or at the output of the TX filter module 85. Such an embodiment will be described in greater detail with reference to FIGS. 3, 5, and 7.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 73, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
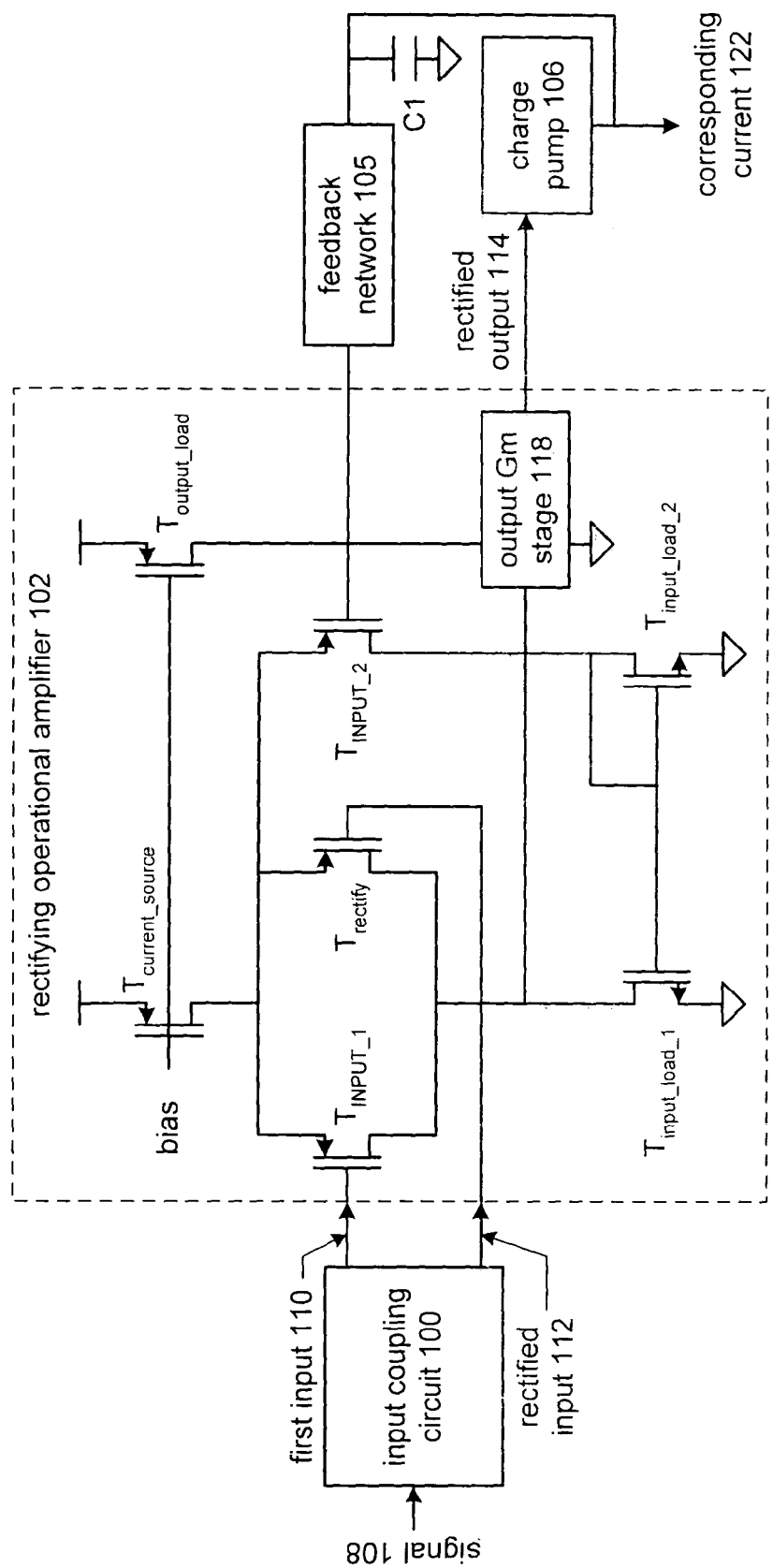
FIG. 3 is a schematic block diagram of a transmit signal strength indication module in accordance with the present invention.

FIG. 3 is a schematic block diagram of the TSSI module 95 that includes an input coupling circuit 100, a rectifying operational amplifier 102, a feedback network 105, and a charge pump 106. The rectifying operational amplifier 102 includes first input transistor ($T_{input\_1}$), a second input transistor ($T_{input\_2}$), a rectifying transistor ($T_{rectify}$), a current source ($T_{current\_source}$), first active input load transistor ($T_{input\_load\_1}$), a second active input load transistor ($T_{input\_load\_2}$), an output load transistor ($T_{output\_load}$), and all output transconductance stage 118.

Figure 4:
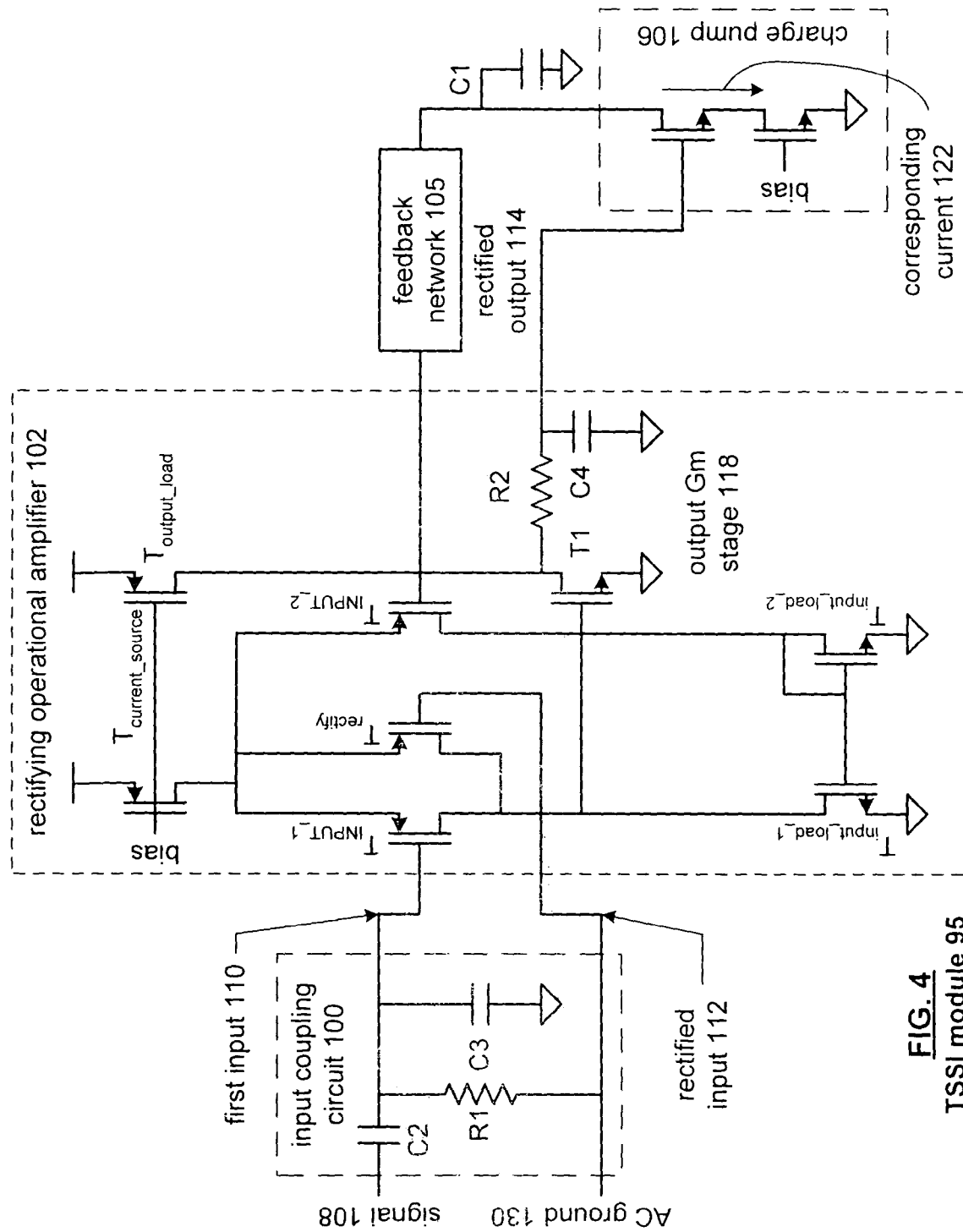
FIG. 4 is a schematic block diagram of another transmit signal strength indication module in accordance with the present invention.
Figure 5:
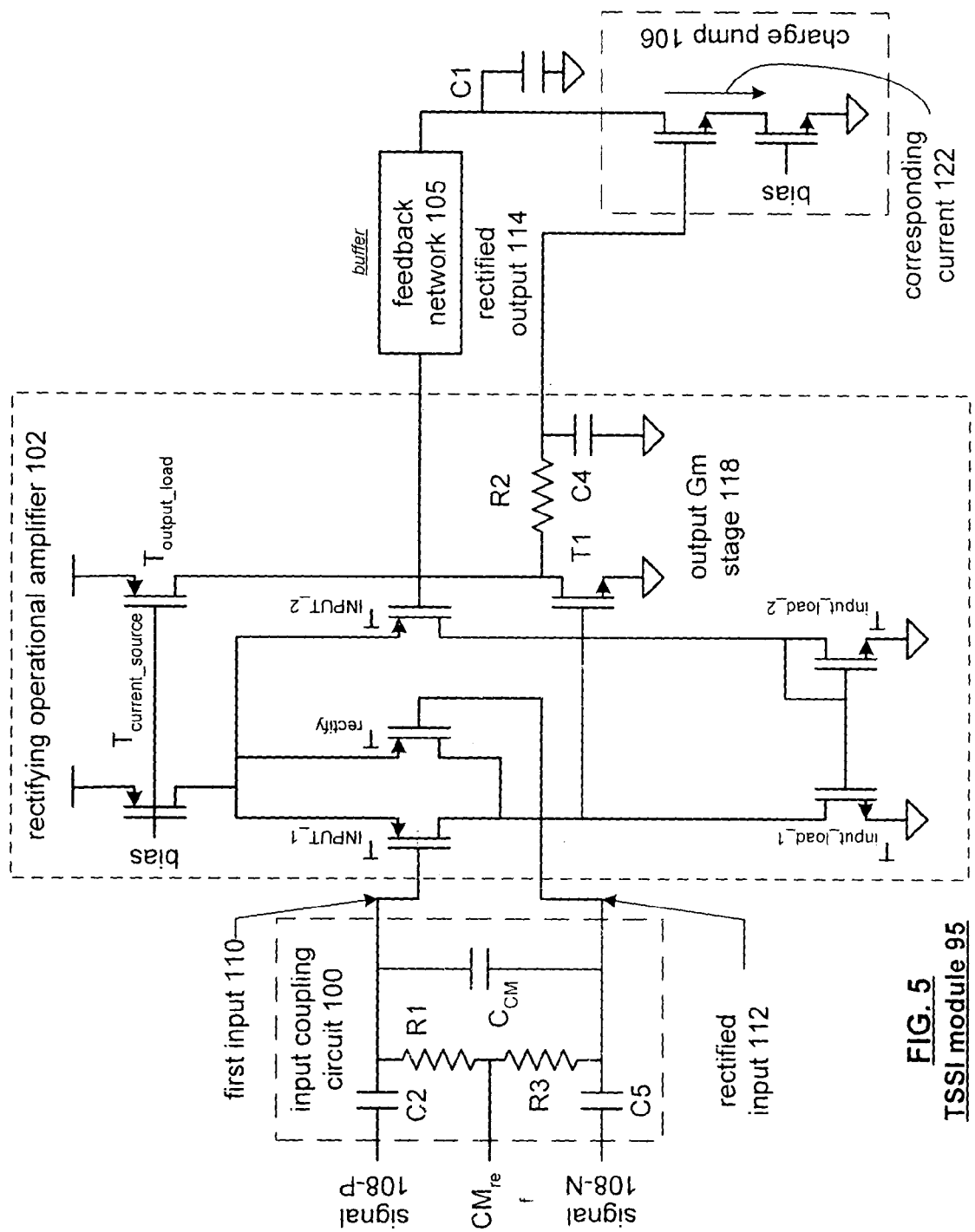
FIG. 5 is a schematic block diagram of yet another transmit signal strength indication module in accordance with the present invention.

The input coupling circuit 100 receives a signal 108, which may be the outbound RF signals 98, and produces therefrom a first input 10 and a rectified input 112. In addition, the input coupling circuit 100 scales the signal 108 to ensure that the resulting signal strength indication is within a desired voltage range, which may be established based on an input range of an analog to digital converter. The analog to digital converter converts the resulting signal strength indication into a digital signal for processing by the digital section of the radio 60. Note that the signal 108 may be a single-ended signal or a differential signal. When the signal 108 is a single-ended signal the input coupling circuit 100 may be configured as shown in FIG. 4. When the signal 108 is a differential signal, the input coupling circuit 100 may be configured as shown in FIG. 5.

The first input transistor ($T_{input\_1}$) receives the first input 110 and the rectifying transistor ($T_{rectify}$) receives the rectified input 112. The second input transistor ($T_{input\_2}$) receives a feedback signal from the feedback network 105, which may be a buffer. With the feedback network 105 being a buffer, the second input transistor, which corresponds to the non-inverting input of the rectifying operational amplifier 102, is effectively coupled to the output of the rectifying operational amplifier 102 to provide a unity gain amplifier.

As shown, the first input transistor ($T_{input\_1}$) and the rectifying transistor ($T_{rectify}$) are coupled to the current source transistor ($T_{current\_source}$) and to the first load transistor ($T_{input\_load\_1}$) and the second input transistor ($T_{input\_2}$) is coupled to the current source transistor ($T_{current\_source}$) and to the second load transistor ($T_{input\_load\_2}$). The Current produced by the current source ($T_{current\_source}$) flows through the first and second load transistors based on the voltages at the gates of the first, second, and rectifying transistors. The amount of current flowing through the first load transistor ($T_{input\_load\_1}$) establishes the input for the transconductance (Gm) stage 118.

To understand the operation of the rectifying operational amplifier 102, it is helpful to first discus the operation of a conventional operational amplifier. Such a conventional operational amplifier includes the current source ($T_{current\_source}$), the first and second input transistors ($T_{input\_1}$) and ($T_{input\_2}$), and the first and second load transistors ($T_{input\_load\_1}$) and ($T_{input\_load\_2}$). Assume that the gate of the second input transistor ($T_{input\_2}$) receives a reference voltage, which may be one-half of the supply voltage, and the first input transistor ($T_{input\_1}$) receives the input signal. In this instance, as the voltage of the input signal varies with respect to the reference voltage, the current of the current source will be proportionally provided to the first and second load transistors. For example, when the voltage of the input signal is less than the reference voltage, the first input transistor will turn on harder, thus drawing more current from the current source, which increases the current through the first load transistor. As the current through the first load transistor increases, so does the output of the operational amplifier, which may be the input to the Gm stage 118. As a further example, when the voltage of the input signal is greater than the reference voltage, the first input transistor turns on less, thus drawing less current from the current source, which increases the current through the second load transistor and decreases the current through the first load transistor. With reduced current in the first load transistor, the output of the operational amplifier is reduced. When the voltage of the input signal is of a sufficient value, all of the current produced by the current source will flow through the first load transistor or the second load transistor, producing a maximum or minimum output of the operational amplifier.

With the addition of the rectifying transistor ($T_{rectify}$), the current through the first load transistor ($T_{input\_load\_1}$) does not fall below a certain level. For example, when the gate voltage of the first input transistor ($T_{input\_1}$) is less than the voltage of the second input transistor ($T_{input\_2}$) and less than the voltage on the gate of the rectifying transistor ($T_{rectify}$), the first input transistor is on more, thus drawing more current from the current source than the second input transistor, which increases the current through the first load transistor. With more current through the first load transistor, the input to the Gm stage 118 is increased, thus increasing the output of the rectifying operational amplifier 102. When the gate voltage of the first input transistor is greater than the voltage of the second transistor and greater than the voltage on the gate of the rectifying transistor, the rectifying transistor draws a fixed level of current from the current source, which is based on its gate voltage. Since the rectifying transistor is drawing a fixed amount of current, the current through the second input transistor will be limited by the current drawn by the rectifying transistor regardless of how much more the voltage on the gate of the first input transistor increases. Thus, when the first load transistor will receive the current from the rectifying transistor, which effectively rectifies the output produced by the rectifying amplifier.

In operation, the rectifying operational amplifier 102 produces a rectified output 114 based on the first input 110 and the rectifying input 112. The charge pump 106 converts the rectified output 114, which represents a rectified peak value of the signal 108, is converted into a current signal 122. The corresponding current signal 122 is converted back to a voltage via the capacitor C1, which corresponds to an envelope of the peak value. The envelope is provided as the input to the feedback network 105. In this embodiment, an accurate, flexible (e.g., handles single-ended and differential signals equally well), and compact transmit signal strength indication module is achieved.

FIG. 4 is a schematic block diagram of the TSSI module 95 that is operably coupled to measure the signal strength of a single-ended version of the signal 108. In this embodiment, the input coupling circuit 100 includes two capacitors C2 and C3 and a resistor R1. The rectifying input 112 is coupled to an AC ground 130 and the first input 112 is a filtered representation, with respect to AC ground, of the signal 108. The functionality of the rectifying operational amplifier 102 is as described with reference to FIG. 3 and produces a half-wave rectified output.

As further illustrated in this embodiment, the transconductance stage 118 include a transistor T1 and a low pass filter, which includes capacitor C4 and resistor R2. As is also illustrated, the charge pump 106 includes two transistors to produce the corresponding current 122.

Figure 6:
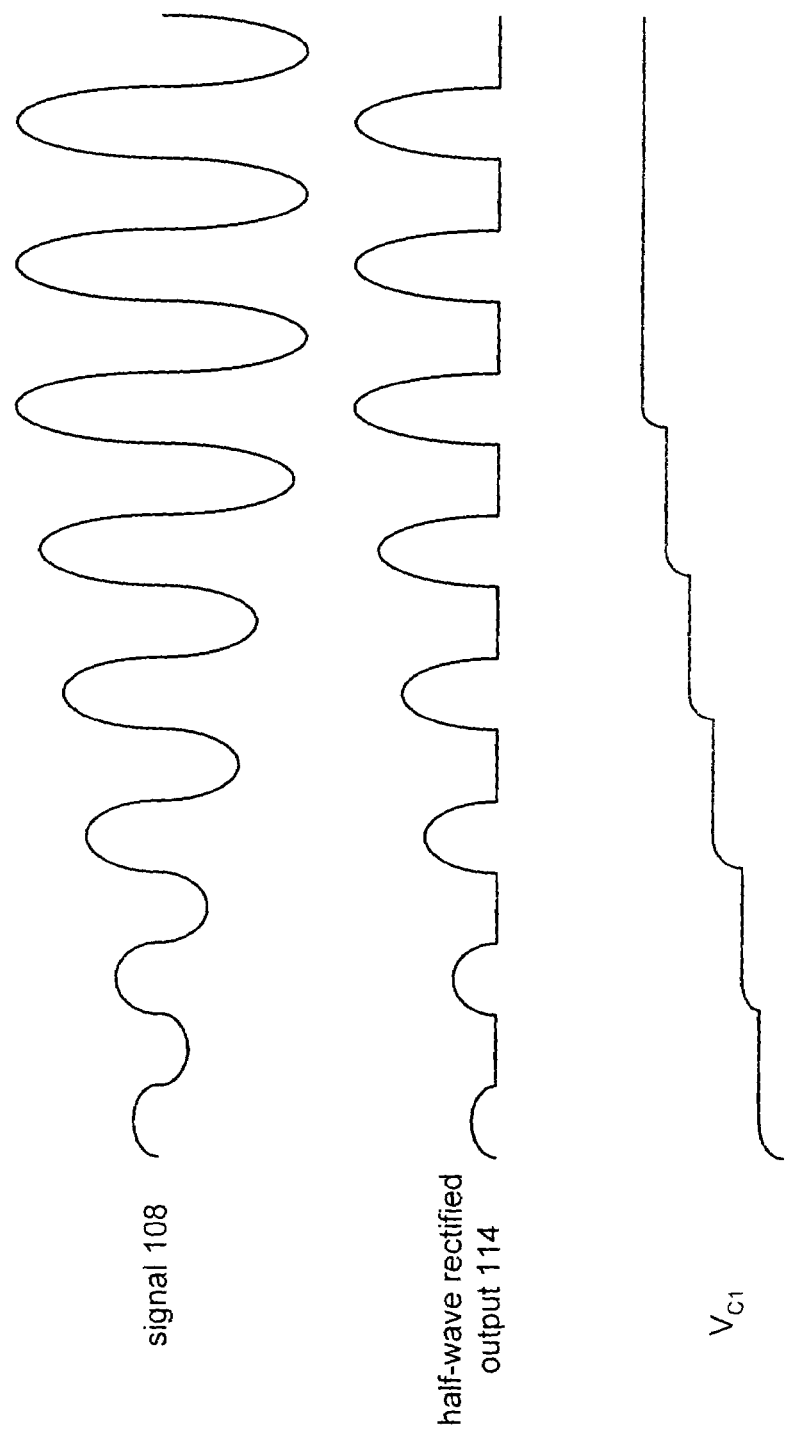
FIG. 6 is a signal diagram of operation of the transmit signal strength indication module of FIG. 4.

The operation of the TSSI module of FIG. 4 may be better described with simultaneous reference to FIG. 6, which illustrates the signal waveforms of the TSSI module. As shown in FIG. 6, the signal 108 may be a sinusoidal signal. As one of average skill in the art will appreciate, signal 108 will most likely be a composition of multiple sinusoidal signals that represent an RF signal, however, for the purposes of illustration, a pure sinusoid signal will be used. With reference to FIG. 4, the first input 110 substantially matches the signal 108 with any high frequency components filtered via the input coupling circuit. AC ground 130 corresponds to the cross over point of the signal 108. Thus, when the signal 108 is positive, the first input 110 is positive providing a voltage above the AC ground to the gate of the first input transistor ($T_{input\_1}$). With the gate voltage of the first transistor being greater than the gate voltage of the rectifying transistor, current from the current source will flow through the rectifying transistor at a fixed level. When the signal 108 is negative, the gate voltage of the first input transistor is less than the gate voltage of the rectifying transistor, thus the current drawing from the current source will map the gate voltage of the first input transistor. Thus, the signal 108 is half-wave rectified, which, in FIG. 6, is illustrated as the half-wave rectified output 114, where the non-constant portion corresponds to when the first input transistor is drawing current from the current source and the constant portion corresponds to when the rectifying transistor is drawing a fixed current from the current source.

The charge pump 106 converts the half-wave rectified output 114 into the corresponding current 122. Capacitor C1 converts the current 122 into a voltage, which is shown in FIG. 6. The voltage of capacitor C1 corresponds to the rectified envelope of the signal 108. The magnitude of the voltage of capacitor C1 represents the magnitude, or signal strength of signal 108. As one of average skill in the art will appreciate, the polarity of the waveforms 108 and 114 and the voltage of capacitor C1 may be reversed.

FIG. 5 is a schematic block diagram of the TSSI module 95 that is operably coupled to measure the signal strength of a differential version of the signal 108. In this embodiment, the input coupling circuit 100 includes three capacitors C2, C5 and $C_{CM}$, and two resistors R1 and R3. The center tap of resistors R1 and R3 is coupled to a common mode voltage reference ($CM_{ref}$), which may be AC ground. Capacitor C2 receives the positive leg of the differential signal 108-P and capacitor C5 receives the negative leg of the differential signal 108-N. The combination of resistors and capacitors of the input coupling circuit 100 filter and scale the differential input signal 108. As is illustrated, the filtered positive leg 108-P is provided as the first input 10 and the filtered negative leg 108-N is provided as the rectified input 112.

As further illustrated in this embodiment, the transconductance stage 118 include a transistor T1 and a low pass filter, which includes capacitor C4 and resistor R2. As is also illustrated, the charge pump 106 includes two transistors to produce the corresponding current 122.

Figure 7:
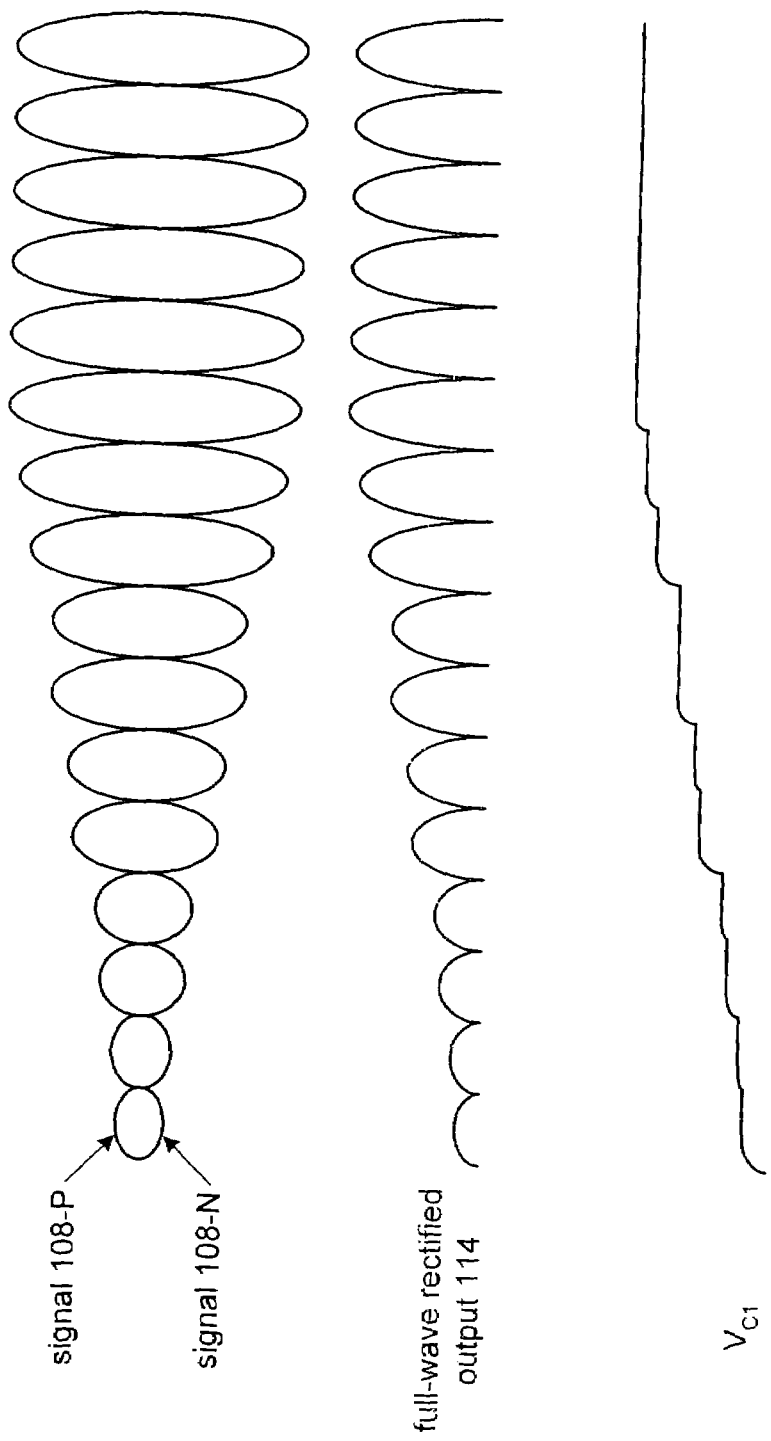
FIG. 7 is a signal diagram of operation of the transmit signal strength indication module of FIG. 5.

The operation of the TSSI module of FIG. 5 may be better described with simultaneous reference to FIG. 7, which illustrates the signal waveforms of the TSSI module. As shown in FIG. 7, the signal 108 may be a sinusoidal signal. As one of average skill in the art will appreciate, signal 108 will most likely be a composition of multiple sinusoidal signals that represent an RF signal, however, for the purposes of illustration, a pure sinusoid signal will be used. With reference to FIG. 5, the first input 110 substantially matches the positive leg of signal 108-P with any high frequency components filtered via the input coupling circuit and the rectified input 112 substantially matches the negative leg of signal 108-N with any high frequency components filtered. Thus, when the positive leg 108-P is greater than the negative leg 108-N, the voltage to the gate of the first input transistor ($T_{input\_1}$) is greater than the gate voltage of the rectifying transistor. With the gate voltage of the first transistor being greater than the gate voltage of the rectifying transistor, current from the current source will flow through the rectifying transistor at a level corresponding to the voltage of the rectified input 112, which corresponds to the negative leg 108-N. When the positive leg 108-P is less than the negative leg 108-N, the gate voltage of the first input transistor is less than the gate voltage of the rectifying transistor, thus the current drawn from the current source will map the gate voltage of the first input transistor. Thus, the signal 108 is full-wave rectified, which, in FIG. 7, is illustrated as the full-wave rectified output 114, where the even pulses result when the negative leg 108-N is greater than the positive leg 108-P and the odd numbered pulses result when the negative leg 108-N is less than the positive leg 108-P.

The charge pump 106 converts the full-wave rectified output 114 into the corresponding current 122. Capacitor C1 converts the current 122 into a voltage, which is shown in FIG. 7. The voltage of capacitor C1 corresponds to the rectified envelope of the signal 108. The magnitude of the voltage of capacitor C1 represents the magnitude, or signal strength of signal 108. As one of average skill in the art will appreciate, the polarity of the waveforms 108 and 114 and the voltage of capacitor C1 may be reversed.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals. etc. provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented an accurate, flexible (e.g., handles single-ended and differential signals equally well), and compact transmit signal strength indication module. As one of average skill in the art will appreciate, other embodiments may be derived from the teachings of the present invention with deviating from the scope of the claims, including, but not limited to, using N-channel transistors in place of the P-channel transistors as illustrated in the figures and using P-channel transistors in place of the N-channel transistors as illustrated in the figures. With the power supply connections inverted.

What is claimed is:

1. A signal power detector comprises:
    an input coupling circuit operably coupled to receive a signal and to convert the signal into a first input and a rectifying input;
    a rectifying operational amplifier including:
        first input transistor operably coupled to receive the first input;
        second input transistor;
        rectifying transistor operably coupled to receive the rectifying input;
        current source operably coupled to provide a reference current to the first input transistor, second input transistor, and the rectifying transistor;
        first active input load transistor operably coupled to provide a first active load for the first input transistor and the rectifying transistor;
        second active input load transistor operably coupled to provide a second active load for the second transistor;
        active output load transistor operably coupled to mirror the reference current; and
        output transconductance stage operably coupled to the active load transistor and to the first input transistor and the rectifying transistor, wherein the output transconductance stage provides a rectified output representing a peak value of the signal; and
    a charge pump operably coupled to convert the rectified output into a corresponding current, wherein the corresponding current represents power of the signal.

2. The signal power detector of claim 1 further comprises a capacitor operably coupled to receive the corresponding current and provide a corresponding voltage that represents the power of the signal.

3. The signal power detector of claim 1 further comprises a feedback network operably coupled between the charge pump and the second input transistor.

4. The signal power detector of claim 1, wherein the signal is a single-ended signal and wherein the input coupling circuit further comprises:
    filtering circuit operably coupled to filter the single-ended signal to produce a filtered single-ended signal, wherein the filtering circuit provides the filtered single-ended signal to the first input transistor as the first input, wherein the filtering circuit provides a DC ground as the rectifying input, and wherein the output transconductance stage provides a half wave rectified output representing the peak value of the signal.

5. The signal power detector of claim 4, wherein the filtering circuit further comprises:
    first capacitor operably coupled to receive the single-ended signal;
    resistor having a first node and a second node, wherein the first node of the resistor is coupled to the first capacitor and second node of the resistor is coupled to the DC ground; and
    a second capacitor operably coupled to the first node of the resistor and to a DC ground, wherein the first and second capacitors scale the single-ended signal.

6. The signal power detector of claim 1, wherein the signal is a differential signal and wherein the input coupling circuit further comprises:
    differential filtering circuit operably coupled to filter the differential signal to produce a filtered differential signal, wherein a positive leg of the filtered differential signal is provided as the first input and a negative leg of the filtered differential signal is provided as the rectifying input, wherein the output transconductance stage provides a full wave rectified output representing the peak value of the signal.

7. The signal power detector of claim 6, wherein the differential filtering circuit further comprises:
first input capacitor operably coupled to receive a positive leg of the differential signal;
second input capacitor operably coupled to receive a negative leg of the differential signal;
first resistor having a first node and a second node, wherein the first node of the first resistor is coupled to the first input capacitor;
second resistor having a first node and a second node, wherein the first node of the second resistor is coupled to the second capacitor, and wherein the second nodes of the first and second resistors are coupled to a common mode reference; and
common mode capacitor operably coupled to the first nodes of the first and second capacitors.

8. The signal power detector of claim 1 further comprises:
the first input transistor, the second input transistor, and the rectifying transistor are implemented as PMOS transistors; and
the first and second active input load transistors are implemented as NMOS transistors.

9. The signal power detector of claim 1 further comprises:
the first input transistor, the second input transistors and the rectifying transistor are implemented as NMOS transistors; and
the first and second active input load transistors are implemented as PMOS transistors.

10. A radio frequency integrated circuit comprises:
a receiver section operably coupled to convert inbound radio frequency signals into inbound intermediate frequency signals;
transmitter section operably coupled to convert outbound intermediate frequency signals into outbound radio frequency signals; and
transmit/receive switch operably coupled to connect either the receiver section or the transmitter section to an antenna, wherein the transmitter section includes:
mixing module operably coupled to convert the outbound low intermediate frequency signal into a radio frequency signal;
power amplifier operably coupled to amplify the radio frequency signal to produce an amplified radio frequency signal;
bandpass filter operably coupled to filter the amplified radio frequency signal to produce the outbound radio frequency signal; and
transmit signal strength indication module operably coupled to monitor transmit power of the power amplifier, the bandpass filter, or the transmit/receive switch, wherein the transmit signal strength indication module includes:
an input coupling circuit operably coupled to receive the amplified radio frequency signal, the outbound radio frequency signal, or a transmit radio frequency signal as an input signal and to convert the input signal into a first input and a rectifying input;
a rectifying operational amplifier including:
first input transistor operably coupled to receive the first input;
second input transistor;
rectifying transistor operably coupled to receive the rectifying input;
current source operably coupled to provide a reference current to the first input transistor second input transistor, and the rectifying transistor;
first active input load transistor operably coupled to provide a first active load for the first input transistor and the rectifying transistor;
second active input load transistor operably coupled to provide a second active load for the second transistor;
active output load transistor operably coupled to mirror the reference current; and
output transconductance stage operably coupled to the active load transistor and to the first input transistor and the rectifying transistor, wherein the output transconductance stage provides a rectified output representing a peak value of the signal; and
a charge pump operably coupled to convert the rectified output into a corresponding current, wherein the corresponding current represents power of the input signal.

11. The radio frequency integrated circuit of claim 10, wherein the transmit signal strength indication module further comprises a capacitor operably coupled to receive the corresponding current and provide a corresponding voltage that represents the power of the signal.

12. The radio frequency integrated circuit of claim 10, wherein the transmit signal strength indication module further comprises a feedback network operably coupled between the charge pump and the second input transistor.

13. The radio frequency integrated circuit of claim 10, wherein the input signal is a single-ended signal and wherein the input coupling circuit further comprises:
filtering circuit operably coupled to filter the single-ended signal to produce a filtered single-ended signal, wherein the filtering circuit provides the filtered single-ended signal to the first input transistor as the first input, wherein the filtering circuit provides a DC ground as the rectifying input, and wherein the output transconductance stage provides a half wave rectified output representing the peak value of the input signal.

14. The radio frequency integrated circuit of claim 13, wherein the filtering circuit further comprises:
first capacitor operably coupled to receive the single-ended signal;
resistor having a first node and a second node, wherein the first node of the resistor is coupled to the first capacitor and second node of the resistor is coupled to the DC ground; and
a second capacitor operably coupled to the first node of the resistor and to a DC ground, wherein the first and second capacitors scale the single-ended signal.

15. The radio frequency integrated circuit of claim 10, wherein the input signal is a differential signal and wherein the input coupling circuit further comprises:
differential filtering circuit operably coupled to filter the differential signal to produce a filtered differential signal, wherein a positive leg of the filtered differential signal is provided as the first input and a negative leg of the filtered differential signal is provided as the rectifying input, wherein the output transconductance stage provides a full wave rectified output representing the peak value of the input signal.

16. The radio frequency integrated circuit of claim 15, wherein the differential filtering circuit further comprises:
first input capacitor operably coupled to receive a positive leg of the differential signal;

second input capacitor operably coupled to receive a negative leg of the differential signal;

first resistor having a first node and a second node, wherein the first node of the first resistor is coupled to the first input capacitor;

second resistor having a first node and a second node, wherein the first node of the second resistor is coupled to the second capacitor, and wherein the second nodes of the first and second resistors are coupled to a common mode reference; and common mode capacitor operably coupled to the first nodes of the first and second capacitors.

17. The radio frequency integrated circuit of claim 10 further comprises:

the first input transistor, the second input transistor, and the rectifying transistor are implemented as PMOS transistors; and the first and second active input load transistors are implemented as NMOS transistors.

18. The radio frequency integrated circuit of claim 10 further comprises:

the first input transistor, the second input transistor, and the rectifying transistor are implemented as NMOS transistors; and the first and second active input load transistors are implemented as PMOS transistors.

* * * * *

UNITED STATES PATENT AND TRADEMARK OFFICE
CERTIFICATE OF CORRECTION

PATENT NO. : 7,113,754 B2
APPLICATION NO. : 10/645126
DATED : September 26, 2006
INVENTOR(S) : Hung-Ming Chien It is certified that error appears in the above-identified patent and that said Letters Patent is hereby corrected as shown below:

Column 12, line 2, in Claim 10: insert a comma after "transistor"

Signed and Sealed this

Thirtieth Day of December, 2008

JON W. DUDAS
*Director of the United States Patent and Trademark Office*